United States Patent
Wang

(10) Patent No.: US 9,362,052 B2
(45) Date of Patent: *Jun. 7, 2016

(54) ELECTRONIC DEVICES WITH FLOATING METAL RINGS

(71) Applicant: MediaTek Inc, Hsin-Chu (TW)

(72) Inventor: YuJen Wang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/600,422

(22) Filed: Jan. 20, 2015

(65) Prior Publication Data
US 2015/0131203 A1    May 14, 2015

Related U.S. Application Data

(60) Continuation of application No. 13/554,164, filed on Jul. 20, 2012, now Pat. No. 8,971,013, which is a division of application No. 12/402,589, filed on Mar. 12, 2009, now abandoned.

(51) Int. Cl.

| | |
|---|---|
| *H01G 4/005* | (2006.01) |
| *H01G 4/012* | (2006.01) |
| *H01G 4/255* | (2006.01) |
| *H01G 4/30* | (2006.01) |
| *H01G 4/33* | (2006.01) |
| *H01L 23/522* | (2006.01) |
| *H01L 23/58* | (2006.01) |
| *H01L 27/08* | (2006.01) |
| *H01L 49/02* | (2006.01) |
| *H01L 27/02* | (2006.01) |

(52) U.S. Cl.
CPC .............. *H01G 4/012* (2013.01); *H01G 4/255* (2013.01); *H01G 4/30* (2013.01); *H01G 4/33* (2013.01); *H01L 23/5223* (2013.01); *H01L 23/5225* (2013.01); *H01L 23/585* (2013.01); *H01L 27/0805* (2013.01); *H01L 28/40* (2013.01); *H01L 27/0207* (2013.01); *H01L 2924/0002* (2013.01)

(58) Field of Classification Search
CPC . H01L 23/5223; H01L 27/0805; H01L 28/40; H01G 4/005; H01G 4/30
See application file for complete search history.

(56) References Cited

U.S. PATENT DOCUMENTS

| | | |
|---|---|---|
| 6,266,226 B1 | 7/2001 | Hayashi |
| 6,410,954 B1 | 6/2002 | Sowlati |
| 6,542,351 B1 | 4/2003 | Kwang |
| 6,635,916 B2 | 10/2003 | Aton |
| 6,690,570 B2 | 2/2004 | Hajimiri |
| 6,785,118 B1 | 8/2004 | Liu et al. |

(Continued)

FOREIGN PATENT DOCUMENTS

| | | |
|---|---|---|
| CN | 101047209 | 10/2007 |
| JP | 2005-108874 | 4/2005 |

*Primary Examiner* — Robert J Hoffberg
*Assistant Examiner* — Hung Dang
(74) *Attorney, Agent, or Firm* — McClure, Qualey & Rodack, LLP

(57) ABSTRACT

A electronic device is provided. In one configuration, the electronic device includes a first electrode formed in a first layer; a second electrode formed in the first layer, wherein the first electrode and the second electrode are reflection symmetrically disposed; and a first floating metal ring formed in the first layer and enclosing the first electrode and the second electrode. The shape of the first electrode is the same shape as the second electrode.

18 Claims, 16 Drawing Sheets

(56) References Cited

U.S. PATENT DOCUMENTS

| | | |
|---|---|---|
| 7,439,570 B2 | 10/2008 | Anthony |
| 7,485,912 B2 | 2/2009 | Wang |
| 2007/0235838 A1 | 10/2007 | Wang |
| 2007/0278551 A1* | 12/2007 | Anthony ............. H01L 23/5223 257/307 |

\* cited by examiner

ELECTRONIC DEVICES WITH FLOATING METAL RINGS

CROSS-REFERENCE TO RELATED APPLICATIONS

The present application is a Continuation application of U.S. patent application Ser. No. 13/554,165, which was filed on Jul. 20, 2012, which is a Divisional application of U.S. patent application Ser. No. 12/402,589, which was filed on Mar. 12, 2009, which is all incorporated by reference herein.

BACKGROUND OF THE INVENTION

1. Field of the Invention

The invention relates to an electronic device, and more particularly to a capacitor with a floating metal ring.

2. Description of the Related Art

Capacitors are essential passive elements in integrated circuits. In integrated circuits, differential signals on two electrodes of a capacitor are easily affected by nearby routed conducting lines. FIG. 1 shows a capacitor of symmetric metal-oxide-metal (MOM) structure. Electrodes E10 and E11 and an oxide layer therebetween form a capacitor CP1. If there is a conducting line L10 near the capacitor CP1, parasitic capacitors are formed between the conducting line L10 and the electrodes E10 and E11. FIG. 2 shows an equivalent circuit of the MOM structure and the conducting line L10. Referring to FIGS. 1 and 2, C10 represents the parasitic capacitor between the conducting line L10 and the electrode E10, and C11 represents the parasitic capacitor between the conducting line L10 and the electrode E11. Noise on the conducting line L10 directly affects the differential signals on the electrodes E10 and E11. Moreover, since the electrode E11 is farther away than the electrode E10 from the conducting line, the parasitic capacitor C11 is smaller than the parasitic capacitor C10, so that, the differential signals on the electrodes E10 and E11 suffer unequal effects from the conducting line L10.

BRIEF SUMMARY OF THE INVENTION

An exemplary embodiment of an electronic device comprises first and second electrodes and a first floating metal ring. The first and second electrodes are formed in a first layer. The first floating metal ring is formed in the first layer and encloses the first electrode and the second electrode. The first electrode and the second electrode are formed in an L-type shape, a ladder-type shape, a finger-type shape, a zipper-type shape, or a hook-type shape.

Another exemplary embodiment of an electronic device comprises first and second electrodes and a first floating metal ring. The first and second electrodes are formed in a first layer and are symmetrically disposed with respect to a first point. The first floating metal ring is formed in the first layer and encloses the first electrode and the second electrode. In some embodiments, the floating metal ring is symmetrically disposed with respect to the first point.

Another exemplary embodiment of an electronic device comprises first and second electrodes and a first floating metal ring. The first and second electrodes are formed in a first layer and are disposed in rotational symmetry with respect to a first symmetry point. The floating metal ring is formed in a first layer and encloses the first electrode and the second electrode. In some embodiments, the floating metal ring is disposed in rotational symmetry with respect to the first symmetry point.

Another exemplary embodiment of an electronic device comprises a first electrode, a second electrode, and a floating plate. The first and second electrodes are formed in a first layer. The floating plate is disposed under the first electrode and the second electrode. In some embodiments, the electronic device further comprises two walls disposed two sides of the electronic device.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIGS. 7a and 7b show the electrodes with zipper-type shapes in the capacitor of FIG. 3a;

FIGS. 8a and 8b show the electrodes with hook-type shapes in the capacitor of FIG. 3a;

FIGS. 9a and 9b show the electrodes with L-type shapes in the capacitor of FIG. 3a;

FIGS. 10a and 10b show the electrodes with ladder-type shapes in the capacitor of FIG. 3a;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
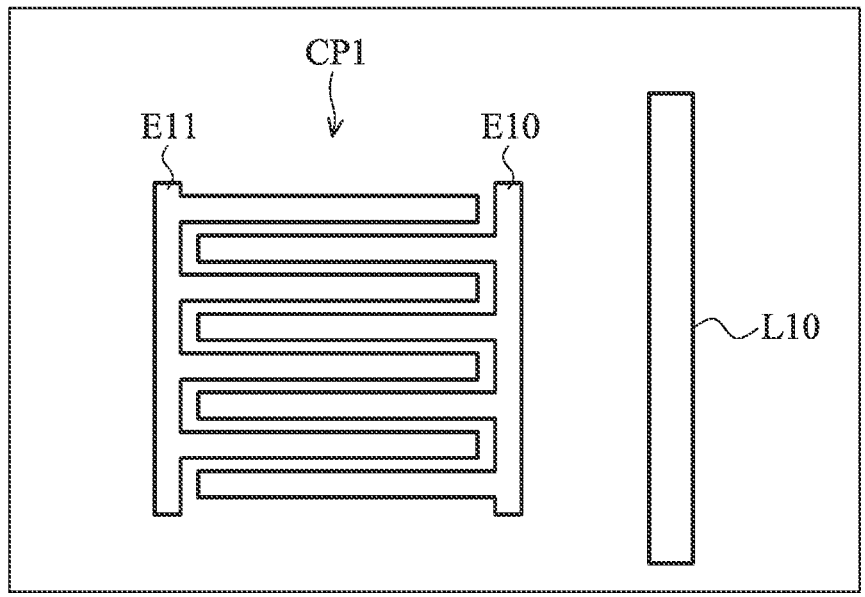
FIG. 1 shows a capacitor of symmetric metal-oxide-metal (MOM) structure.
Figure 2:
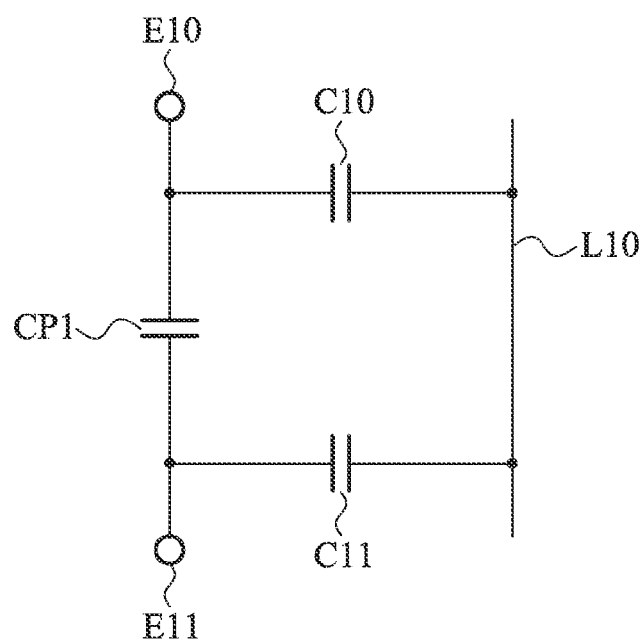
FIG. 2 shows an equivalent circuit of the MOM structure and the nearby conducting line of FIG. 1.
Figure 3A:
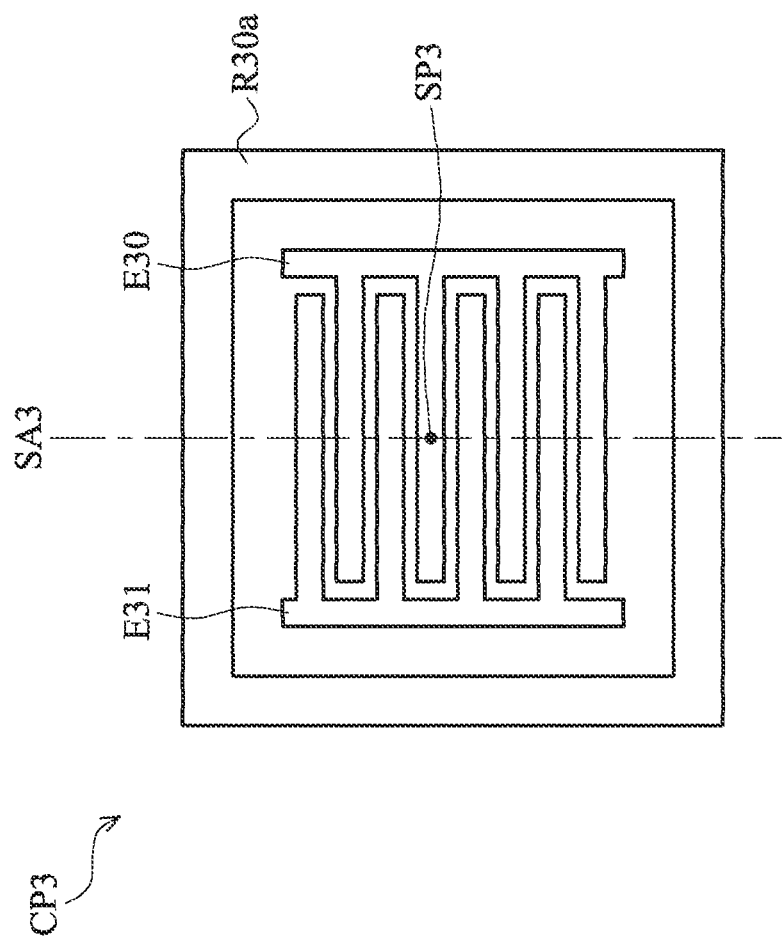
FIG. 3a shows an exemplary embodiment of a capacitor.
Figure 3B:
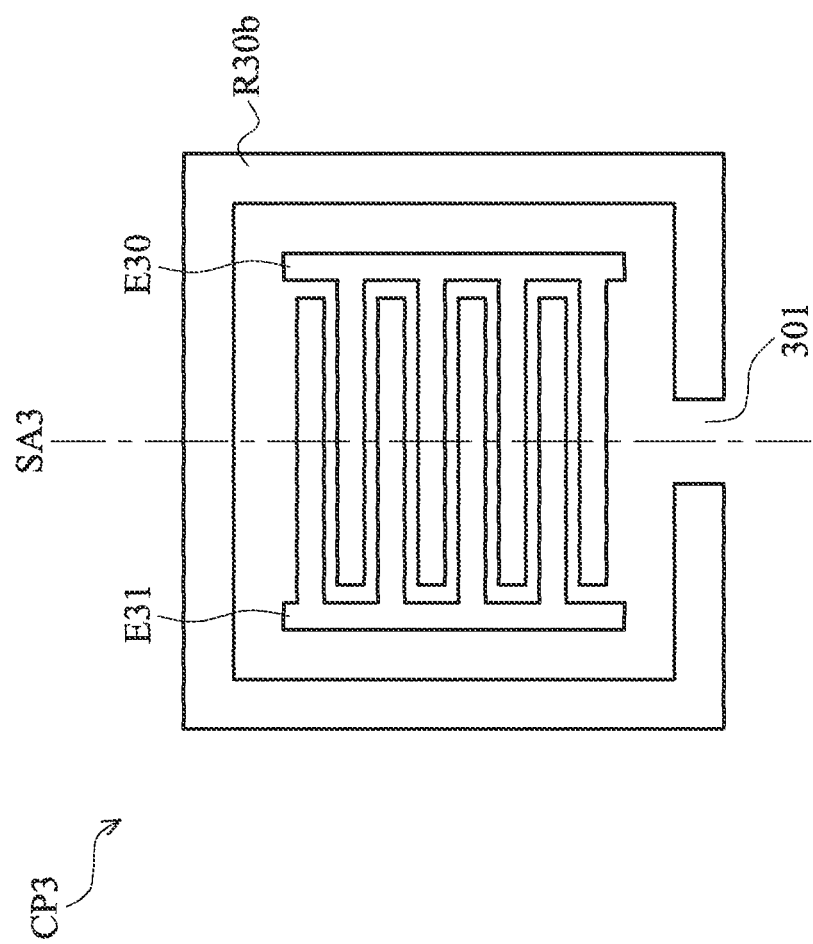
FIG. 3b shows an exemplary embodiment of a capacitor.
Figure 4:
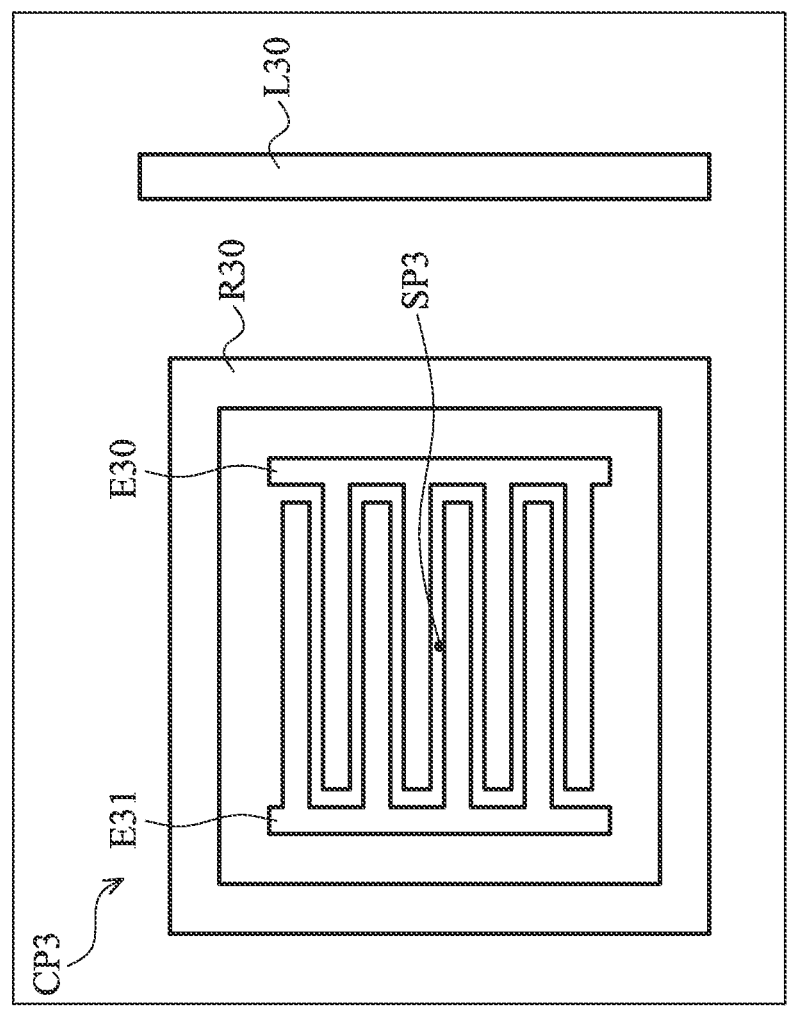
FIG. 4 shows the capacitor of FIG. 3a and a nearby conducting line.

Capacitors are provided. In an exemplary embodiment of a capacitor in FIG. 3a, a capacitor CP3 comprises electrodes E30 and E31, an insulator (not shown), and a floating metal ring R30a. The insulator can be oxide, so that the capacitor CP3 has a metal-oxide-metal (MOM) structure. In this embodiment, the electrodes E30 and E31, the insulation layer, and the floating metal ring R30a are formed in the same layer. Referring to FIG. 3a, each of the electrodes E30 and E31 has a finger-type shape, and the electrodes E30 and E31 are symmetrically disposed with respect to a point SP3. Fingers of the electrodes E30 and E31 extend toward the symmetry axis SA3 and are alternately disposed. The floating metal ring R30a encloses the electrodes E30 and E31 and is symmetrically disposed with respect to the point SP3. Referring to FIG. 4, it is assumed that there is a conducting line L30 near the capacitor CP3. Due to the floating metal ring R30a, noise on the conducting line L30 does not directly affect the differential signals on the electrodes E30 and E31.

Figure 5:
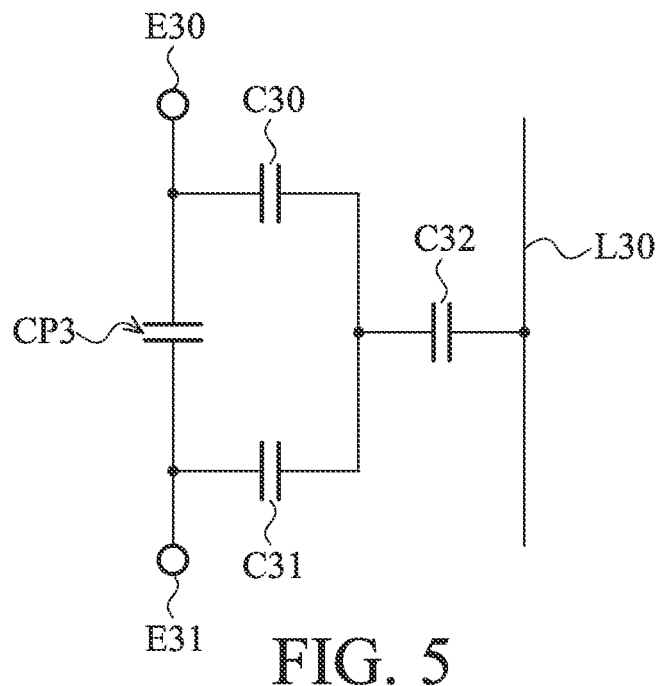
FIG. 5 shows an equivalent circuit of the capacitor and the nearby conducting line of FIG. 4.

FIG. 5 shows an equivalent circuit of the capacitor CP3 and the conducting line L30. A parasitic capacitor C30 is formed between the floating metal ring R30a and the electrode E30, and a parasitic capacitor C31 is formed between the floating metal ring R30a and the electrode E31. A parasitic capacitor C32 is formed between the conducting line L30 and the capacitor CP3. Since the electrodes E30 and E31 and the floating metal ring R30a are symmetrically disposed with respect to the point SP3, the parasitic capacitors C30 and C31 between the floating metal ring R30a and the electrodes E30 and E31 have the same capacitance, so that the differential signals on the electrodes E30 and E31 suffer equal effects from the conducting line L30.

Figure 6:
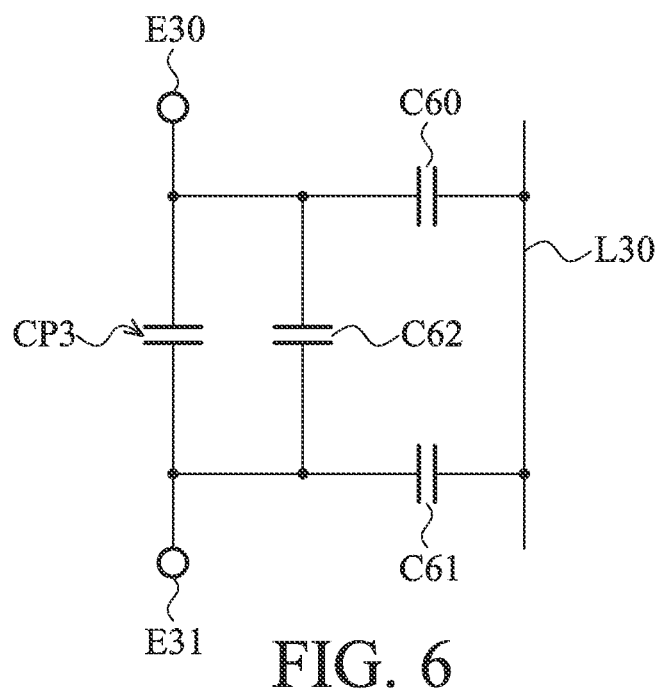
FIG. 6 shows an equivalent circuit transformed from the equivalent circuit of FIG. 5 by Y-Δ transformation.

In another aspect, the capacitance between the electrodes E30 and E31 can be increased due to the disposition of the floating metal ring R30a. FIG. 6 shows an equivalent circuit transformed from the equivalent circuit in FIG. 5 by Y-Δ transformation. Capacitors C60-C62 in FIG. 6 are formed according to the capacitors C30-C32 in FIG. 5, and shown in following equations:

$$c60 = c61 = \frac{c32 \times c30}{c32 + 2c30} = \frac{c32}{\frac{c32}{c30} + 2} < \frac{c32}{2}, \text{ and}$$

$$c62 = \frac{c30^2}{c32 + 2c30} = \frac{c30}{\frac{c32}{c30} + 2} < \frac{c30}{2},$$

wherein, c30-c32 and c60-c62 represent the capacitance of the capacitance capacitors C30-C32 and C60-C62, respectively.

According to above equations, since the capacitor CP3 and C62 are coupled in parallel, the capacitance between the electrodes E30 and E31 is increased from cp3 to cp3+c62, wherein cp3 represents the capacitance of the capacitor CP3. Moreover, the values c60 and c61 of the parasitic capacitors C60 and C61 between the conducting line L30 and the electrodes E30 and E31 are equal, and each of the values c60 and c61 is less than $$\frac{c32}{2},$$

so that the differential signals on the electrodes E30 and E31 suffer equal effects from the conducting line L30, and the effects on the differential signals are weak.

In the embodiment of FIG. 3a, the floating metal ring R30a strictly encloses the electrodes E30 and E31. In some embodiments, a floating metal ring R30b has a breaking 301, so that the floating metal ring R30b does not strictly enclose the electrodes E30 and E31. Moreover, the floating metal ring R30b is symmetrically disposed with respect to a symmetry axis SA3.

In the embodiment of FIG. 3a, the capacitor CP3 is formed by a single layer with the electrodes E30 and E31, the insulator, and the floating metal ring R30a. In other embodiments, the capacitor CP3 can be form by a plurality of layers with electrodes. Each of the layers comprises electrodes E30 and E31 and the insulator, and at least one layer comprises the floating metal ring R30a. Referring to FIG. 3a, the electrodes E30 and E31 with the finger-type shape are symmetrically disposed with respect to the point SP3. However, the shapes of the electrodes E30 and E31 are not limited to the finger-type shape. The electrodes E30 and E31 can have any shape to be symmetrically disposed with respect to the point SP3.

Figure 7B:
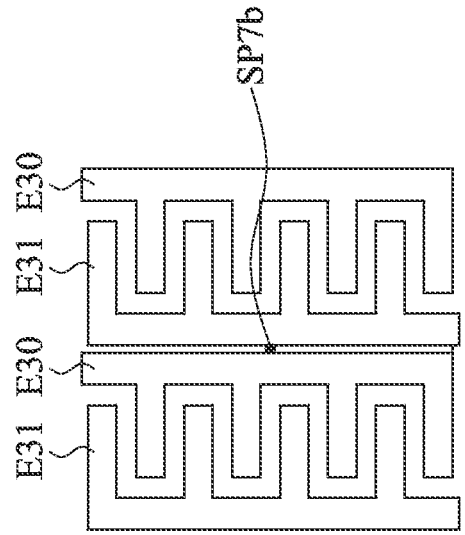
Figure 7A:
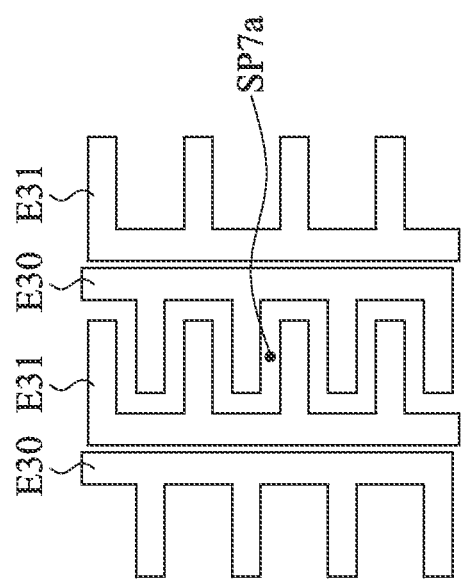
Figure 7C:
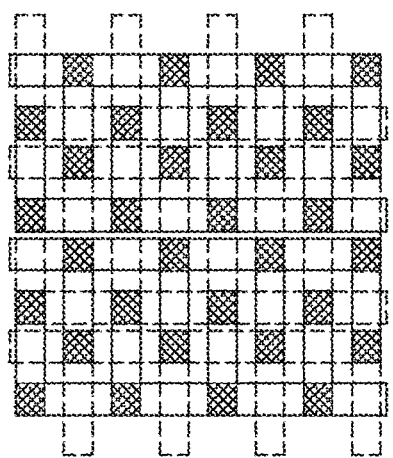
FIG. 7c shows a woven structure formed by overlapping the electrodes with the zipper-type shapes of FIGS. 7a and 7b in two layers.
Figure 8B:
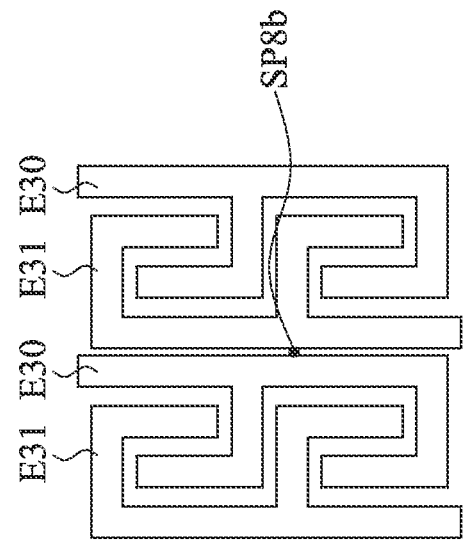
Figure 8A:
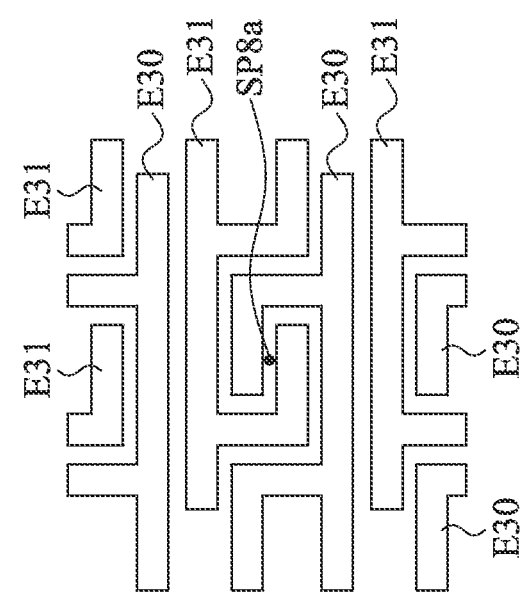
Figure 8C:
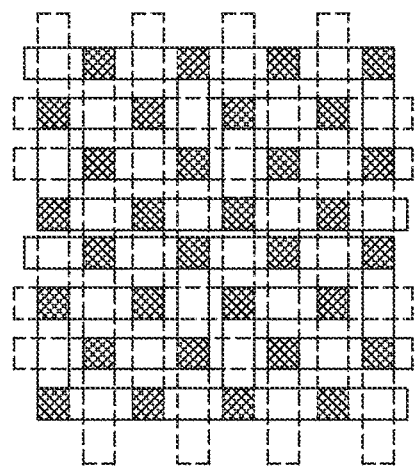
FIG. 8c shows another woven structure formed by overlapping the electrodes with the hook-type shapes of FIGS. 8a and 8b in two layers.

In some embodiments, the electrodes E30 and E31 can be disposed in rotational symmetry with respect to a symmetry point. For example, the electrodes E30 and E31 of the capacitor CP3 can have zipper-type shapes as shown in FIGS. 7a and 7b or hook-type shapes as shown in FIGS. 8a and 8b. The electrodes E30 and E31 with the zipper-type shapes in FIGS. 7a and 7b are respectively disposed in rotational symmetry with respect to symmetry points SP7a and SP7b. The electrodes E30 and E31 with the hook-type shapes in FIGS. 8a and 8b are respectively disposed in rotational symmetry with respect to symmetry points SP8a and SP8b. If the capacitor CP3 is formed by electrodes in a plurality of layers, each of the layers comprises electrodes E30 and E31 with the zipper-type shape or the hook-type shape and the insulator, and at least one layer comprises the floating metal ring R30a. In following, it is assumed that the capacitor CP3 is formed by electrodes in two layers. When the electrodes E30 and E31 of one layer have the zipper-type shape as in FIG. 7a and those of the other layer have the zipper-type shape as in FIG. 7b, the capacitor CP3 is formed in a woven structure by overlapping the two layers, as shown in FIG. 7c. Similarly, when the electrodes E30 and E31 of one layer have the hook-type shape as in FIG. 8a and those of the other layer have the hook-type shape as in FIG. 8b, the capacitor CP3 is formed in a woven structure, as shown in FIG. 8c, by overlapping the two layers. Moreover, according to symmetric geometry, the electrodes E30 and E31 with the figure-type shape and the floating metal ring R30a as in FIG. 3a are also disposed in rotational symmetry with respect to a symmetry point SP3. In FIGS. 7c and 8c, two layers of a capacitor are coupled together through vias represented by dark blocks.

According to above description, electrodes in one layer of a capacitor are disposed in rotational symmetry with respect to a symmetry point, and a floating metal ring in the same layer encloses the electrodes. Noise on a nearby conducting line does not directly affect differential signals on the electrodes. The differential signals suffer equal effects from the conducting line, and the effects on the differential signals are weak.

Figure 9B:
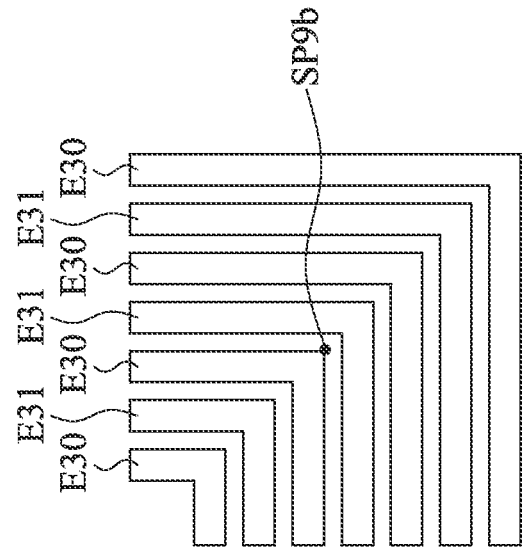
Figure 9A:
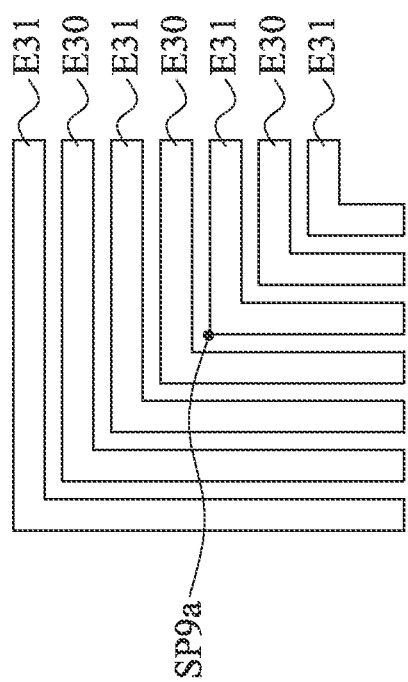
Figure 9C:
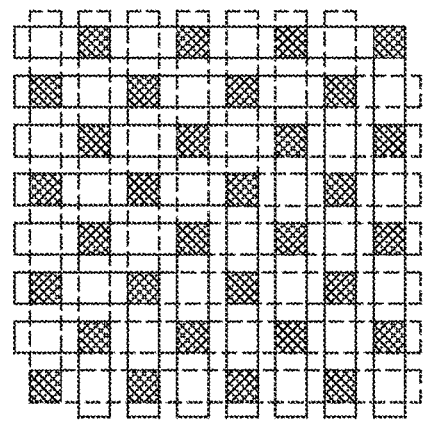
FIG. 9c shows a woven structure formed by overlapping the electrodes with the L-type shapes of FIGS. 9a and 9b in two layers.
Figure 10B:
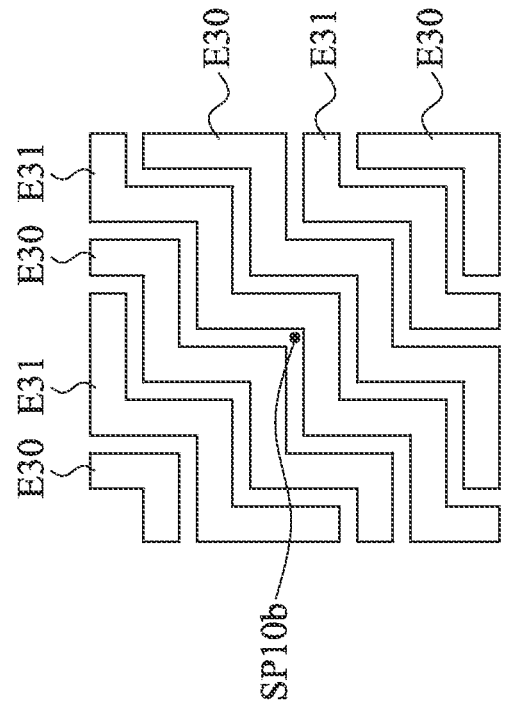
Figure 10A:
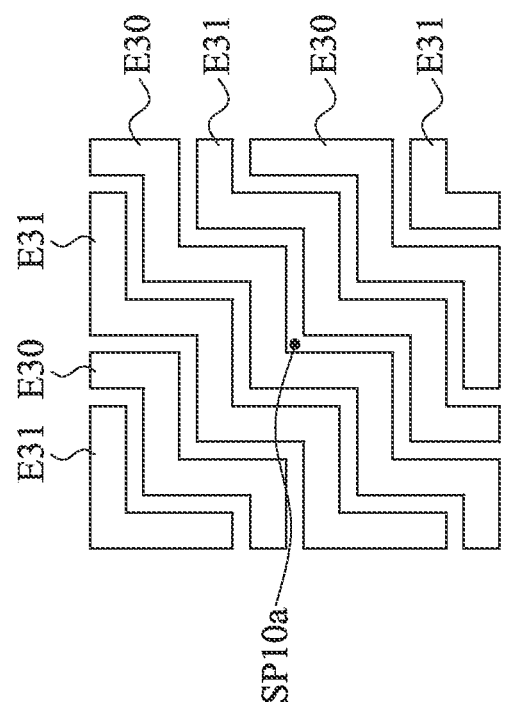
Figure 10C:
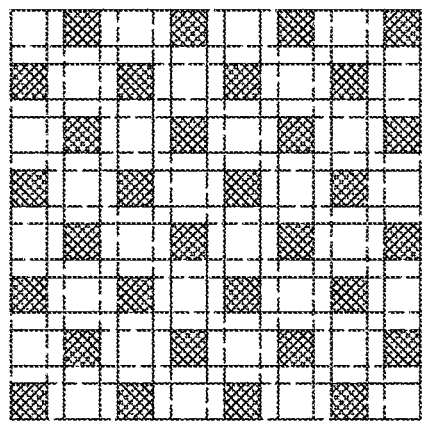
FIG. 10c shows another woven structure formed by overlapping the electrodes with the ladder-type shapes of FIGS. 10a and 10b in two layers.

In other some embodiments, the electrodes E30 and E31 can be disposed in asymmetry. For example, the electrodes E30 and E31 of the capacitor CP3 can have L-type shapes as shown in FIGS. 9a and 9b or ladder-type shapes as shown in FIGS. 10a and 10b. If the capacitor CP3 is formed by electrodes in a plurality of layers, each of the two layers comprises electrodes E30 and E31 with the L-type shape or the ladder-type shape and the insulator, and at least one layer comprises the floating metal ring R30a. In following, it is assumed that the capacitor CP3 is formed by electrodes in two layers. When the electrodes E30 and E31 of one layer have the L-type shape as in FIG. 9a and those of the other layer have the L-type shape as in FIG. 9b, the capacitor CP3 is formed in a woven structure by overlapping the two layers, as shown in FIG. 9c. Similarly, when the electrodes E30 and E31 of one layer have the ladder-type shape as in FIG. 10a and those of the other layer have the ladder-type shape as in FIG. 10b, the capacitor CP3 is formed in a woven structure, as shown in FIG. 10c, by overlapping the two layers. In FIGS. 9c and 10c, two layers of a capacitor are coupled together through vias represented by solid blocks.

According to the above description, a capacitor comprises two electrodes disposed in asymmetry and two connected floating metal rings, each enclosing the electrode in the same layer, so that noise on a nearby conducting line does not directly affect differential signals on the electrodes.

Figure 11:
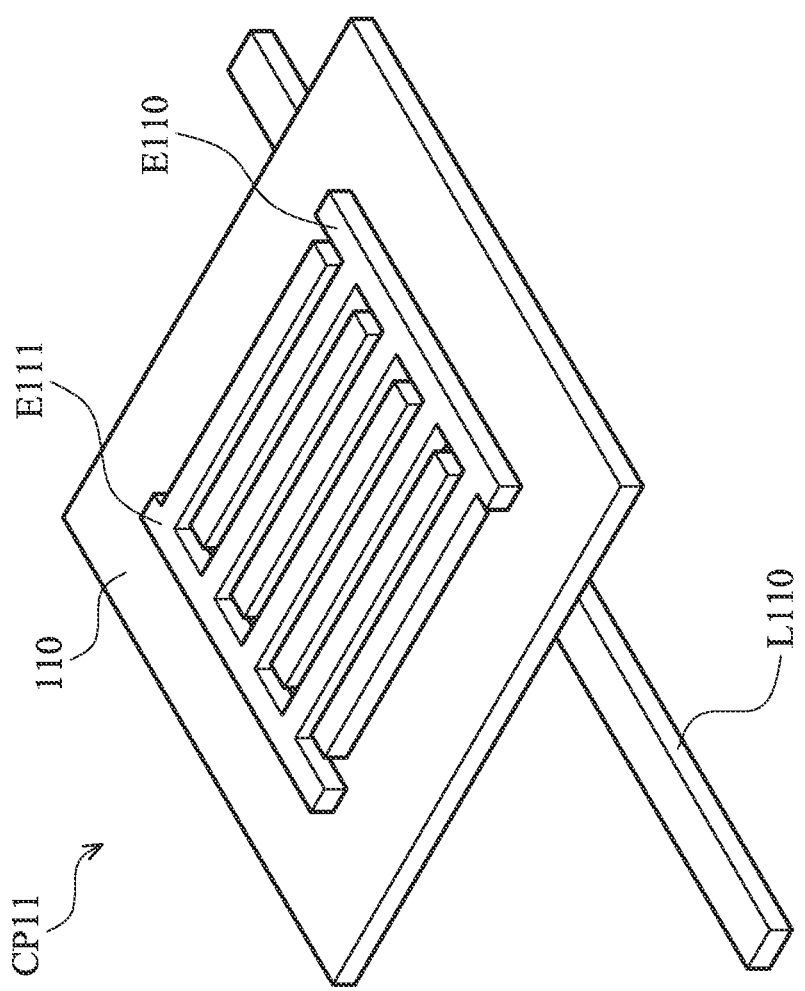
FIG. 11 shows an exemplary embodiment of a capacitor.

In another embodiment of a capacitor in FIG. 11, a capacitor CP11 comprises electrodes E110 and E111, an insulator (not shown), and a floating plate 110. The electrodes E110 and E111 can have a symmetric shape, such as the sharps of FIGS. 3a, 7a, 7b, 8a, and 8b. The floating plate 110 is disposed under the electrodes E110 and E111. A parasitic capacitor is formed between the floating plate 110 and the electrode E110, and another parasitic capacitor is formed between the floating plate 110 and the electrode E111. Since the electrodes E110 and E111 have the symmetric shape, these parasitic capacitors between the floating plate 110 and the electrodes E110 and E111 have the same capacitance, so that the differential signals on the electrodes E110 and E111 suffer equal effects from the conducting line L110. Thus, the floating plate 110 can shield against imbalance capacitance effect between the line L110 and the electrodes E110 and E111.

Figure 12:
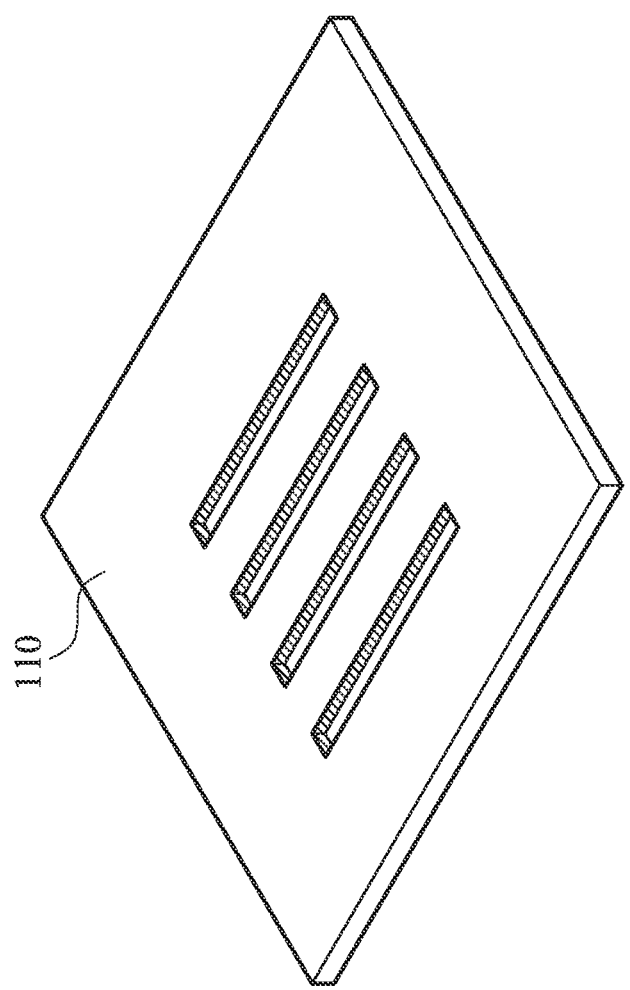
FIG. 12 shows an exemplary embodiment of the floating plate of the capacitor in FIG. 11.

In the embodiment of FIG. 11, the surface of the floating plate 110 is smooth. In some embodiments, the floating plate 110 can have trenches or slices or other kinds of holds. The floating plate 110 with trenches in FIG. 12 is given as an example.

Figure 13:
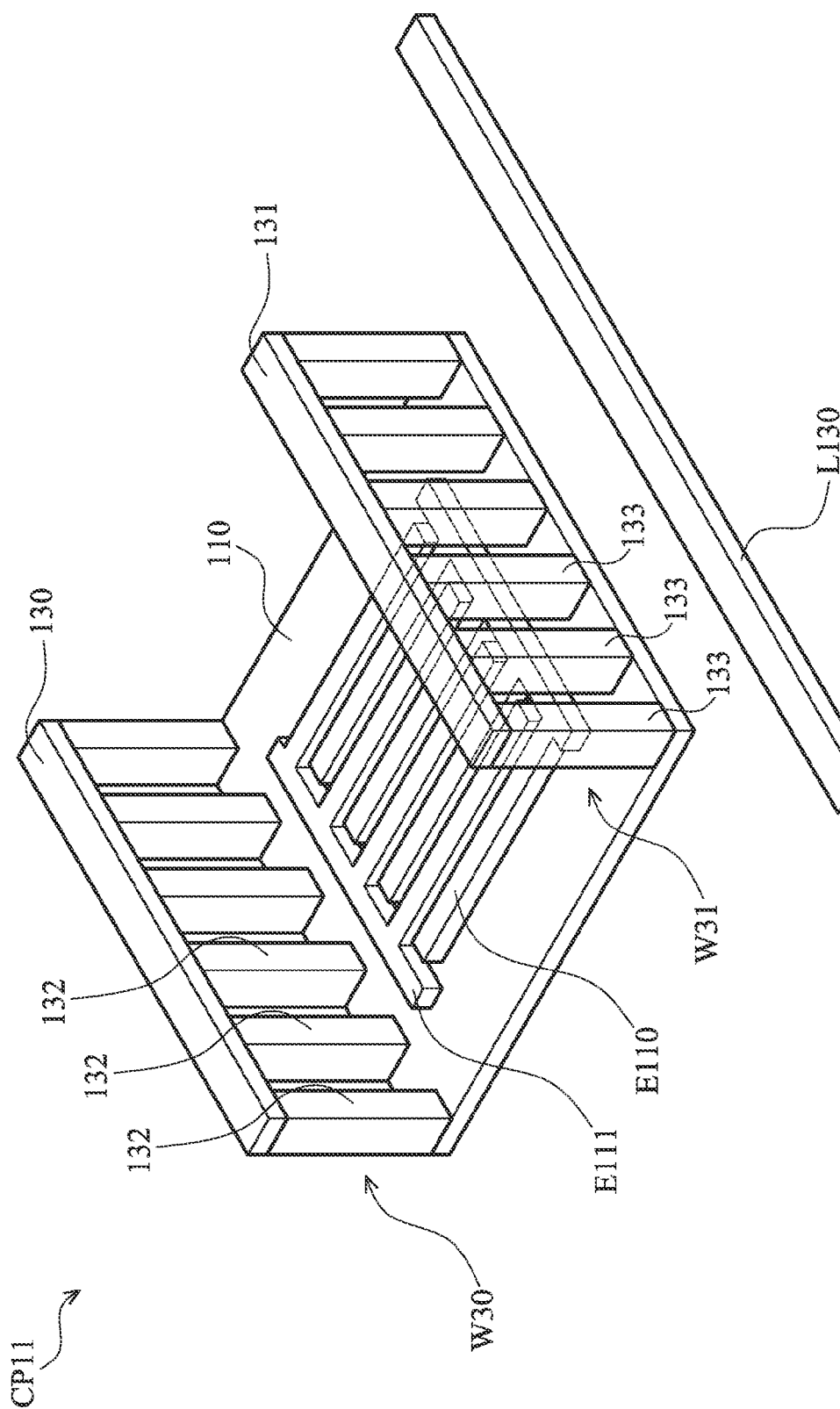
FIG. 13 shows an exemplary embodiment of a capacitor.

Moreover, the capacitor CP11 of FIG. 11 may further comprise walls. As shown in FIG. 13, the capacitor CP11 further comprises walls W30 and W31 which are disposed two sides of the capacitor CP11. In this embodiment, the walls W30 and W31 are disposed the two opposite sides of the capacitor CP11. One wall W30 is formed by an upper conductive line 130 and lower conductive lines 132, and the upper conductive line 130 is connected with the lower conductive lines 132. There are holds formed between the lower conductive lines 132 the upper conductive line 130, and the corresponding side of the capacitor CP11. The other wall W31 is formed by an upper conductive line 132 and lower conductive lines 133, and the upper conductive line 132 is connected with lower the conductive lines 133. There are holds formed between the lower conductive lines 133, the upper conductive line 132, and the corresponding side of the capacitor CP11. The walls W30 and W31 and the floating plate 110 can shield against imbalance capacitance effect between the line L130 and the electrodes E110 and E111.

The floating metal rings, the floating plate, and the walls which are provided to shield against imbalance capacitance are not limited to a capacitor element. In some embodiments, the floating metal rings, the floating plate, and the walls can be used to shield against imbalance capacitance occurred in a resistor element or any other circuit, such as an amplifier circuit.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device comprising:
a first electrode formed in a first layer;
a second electrode formed in the first layer, wherein the first electrode and the second electrode are reflection symmetrically disposed; and
a first floating metal ring formed in the first layer and enclosing the first electrode and the second electrode,
wherein shape of the first electrode is the same shape as the second electrode.

2. The electronic device as claimed in claim 1, wherein the floating metal ring is symmetrically disposed with respect to the first point.

3. The electronic device as claimed in claim 1, wherein the first electrode and the second electrode are formed in a finger-type shape.

4. The electronic device as claimed in claim 3, wherein fingers of the first and second electrodes extend toward the symmetry axis.

5. The electronic device as claimed in claim 4, wherein the fingers of the first and second electrodes are alternately disposed.

6. The electronic device as claimed in claim 1 further comprising:
a third electrode formed in a second layer; and
a fourth electrode formed in the second layer.

7. The electronic device as claimed in claim 6 further comprising:
a second floating metal ring formed in the second layer and enclosing the third electrode and the fourth electrode.

8. The electronic device as claimed in claim 7, wherein the third electrode and the fourth electrode are symmetrically disposed with respect to a second point, and the second floating metal ring is symmetrically disposed with respect to the second point.

9. The electronic device as claimed in claim 6, wherein the first and the second electrodes in the first layer overlap the third and fourth electrodes in the second layer to form a woven structure.

10. An electronic device comprising:
a first electrode formed in a first layer;
a second electrode formed in the first layer, wherein the first electrode and the second electrode are disposed as a mirror image thereto; and
a first floating metal ring formed in the first layer and enclosing the first electrode and the second electrode,
wherein shape of the first electrode is the same shape as the second electrode.

11. The electronic device as claimed in claim 10, wherein the floating metal ring is symmetrically disposed with respect to the first point.

12. The electronic device as claimed in claim 10, wherein the first electrode and the second electrode are formed in a finger-type shape.

13. The electronic device as claimed in claim 12, wherein fingers of the first and second electrodes extend toward the symmetry axis.

14. The electronic device as claimed in claim 13, wherein the fingers of the first and second electrodes are alternately disposed.

15. The electronic device as claimed in claim 10 further comprising:
a third electrode formed in a second layer; and
a fourth electrode formed in the second layer.

16. The electronic device as claimed in claim 15 further comprising:
a second floating metal ring formed in the second layer and enclosing the third electrode and the fourth electrode.

17. The electronic device as claimed in claim 16, wherein the third electrode and the fourth electrode are symmetrically disposed with respect to a second point, and the second floating metal ring is symmetrically disposed with respect to the second point.

18. The electronic device as claimed in claim 15, wherein the first and the second electrodes in the first layer overlap the third and fourth electrodes in the second layer to form a woven structure.

* * * * *